(12) United States Patent
Rori et al.

(10) Patent No.: US 10,580,506 B2
(45) Date of Patent: Mar. 3, 2020

(54) SEMICONDUCTOR MEMORY DEVICE AND ERASE METHOD INCLUDING CHANGING ERASE PULSE MAGNITUDE FOR A MEMORY ARRAY

(71) Applicant: Micron Technology, Inc., Boise, ID (US)

(72) Inventors: Fulvio Rori, Boise, ID (US); Chiara Cerafogli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 46 days.

(21) Appl. No.: 15/835,129

(22) Filed: Dec. 7, 2017

(65) Prior Publication Data

US 2019/0180832 A1 Jun. 13, 2019

(51) Int. Cl.
| | |
|---|---|
| *G11C 16/06* | (2006.01) |
| *G11C 16/34* | (2006.01) |
| *G11C 16/04* | (2006.01) |
| *G11C 16/32* | (2006.01) |
| *G11C 16/16* | (2006.01) |
| *G11C 11/56* | (2006.01) |

(52) U.S. Cl.
CPC ...... *G11C 16/3472* (2013.01); *G11C 16/0483* (2013.01); *G11C 16/16* (2013.01); *G11C 16/32* (2013.01); *G11C 16/3445* (2013.01); *G11C 11/56* (2013.01)

(58) Field of Classification Search
CPC . G11C 16/3472; G11C 16/0483; G11C 16/16; G11C 16/32; G11C 16/3445
USPC ........... 365/185.11, 185.17, 185.18, 185.22, 365/185.29
See application file for complete search history.

(56) References Cited

U.S. PATENT DOCUMENTS

| | | |
|---|---|---|
| 5,132,935 A | 7/1992 | Ashmore |
| 6,009,014 A | 12/1999 | Hollmer et al. |
| 7,200,708 B1 | 4/2007 | Kreifels |
| 7,633,804 B2 | 12/2009 | Nobunaga |
| 8,036,044 B2 | 10/2011 | Dong et al. |
| 8,194,458 B2 | 6/2012 | Lee et al. |
| 8,891,308 B1 | 11/2014 | Ou et al. |
| 9,214,240 B2 | 12/2015 | Dutta et al. |
| 9,330,778 B2 | 5/2016 | Costa et al. |
| 9,711,229 B1 | 7/2017 | Rabkin et al. |
| 2006/0158940 A1 | 7/2006 | Shappir et al. |
| 2008/0151619 A1 | 6/2008 | Melik-Martirosian |
| 2012/0113720 A1* | 5/2012 | Kim ................... G11C 16/3445 365/185.11 |

(Continued)

*Primary Examiner* — Connie C Yoha
(74) *Attorney, Agent, or Firm* — Brooks, Cameron & Huebsch, PLLC

(57) ABSTRACT

An example method includes, performing a first erase verify on a first set of memory cells of a portion of an array of memory cells, performing a second erase verify on a second set of memory cells of the portion of the array, applying a first erase voltage pulse concurrently to each memory cell in the portion of the array if the first set fails the first erase verify and if the second set fails the second erase verify, and applying a second erase voltage pulse concurrently to each memory cell in the portion of the array if the first set passes the first erase verify and if the second set fails the second erase verify. The second erase voltage pulse is different than the first erase voltage pulse.

24 Claims, 7 Drawing Sheets

(56) References Cited

U.S. PATENT DOCUMENTS

| | | | | |
|---|---|---|---|---|
| 2012/0206972 A1* | 8/2012 | Shiino | ............... | G11C 16/16 |
| | | | | 365/185.19 |
| 2012/0275232 A1* | 11/2012 | Park | ............... | G11C 16/0483 |
| | | | | 365/185.19 |
| 2019/0122741 A1* | 4/2019 | Cheng | ............... | G11C 16/3495 |

* cited by examiner

SEMICONDUCTOR MEMORY DEVICE AND ERASE METHOD INCLUDING CHANGING ERASE PULSE MAGNITUDE FOR A MEMORY ARRAY

TECHNICAL FIELD

The present disclosure relates generally to apparatus, such as electronic storage systems, and methods, and more particularly, to erase operations, such as in electronic storage systems.

BACKGROUND

Electronic storage systems may be implemented in electronic systems, such as computers, cell phones, hand-held electronic devices, etc. Some storage systems, such as solid state drives (SSDs), may include non-volatile memory devices. Non-volatile memory devices provide persistent data by retaining stored data when not powered and may include NAND flash memory, among other types of non-volatile memory.

In some examples, a NAND flash memory may include groups (e.g., strings) of series-coupled (e.g., one-transistor) non-volatile memory cells. The series-coupled memory cells in a string, for example, may be between a data line (e.g., a bit line) and a source. For example, the memory cells in a string may be coupled in series source to drain. Memory cells at respective locations in the strings, for example, may be commonly coupled to respective access lines, such as word lines.

A number of strings may be grouped together to form a block of memory cells. A block may include physical pages. For example, a physical page may include a number of memory cells whose control gates are commonly coupled to an access line. A read or write operation in NAND memory may be performed at the page level, but erase operations are performed at the block level. Non-volatile memory cells may be typically programmed using program/erase cycles. Such a cycle might involve first erasing the memory cells as a block and then programming the memory cells (e.g., in pages).

A typical erase operation may involve concurrently applying a number of erase voltage pulses to (e.g., across) each memory cell in each string in a block, such as by applying the erase voltage pulses to channels of the memory cells, such as to a semiconductor on which the block is formed, while concurrently applying a common low voltage, such as a ground voltage, to all of the access lines. After each application of an erase voltage, an erase verify may be performed to determine whether the block is erased, for example, by determining if the threshold voltages (Vts) of the memory cells have reached an erase Vt level. If the block is erased, the erase operation is complete. Otherwise, the magnitude of voltage and/or the time duration of the erase pulse may be subsequently increased, and a subsequent erase verify may be performed after each erase pulse until the block is verified as erased.

DETAILED DESCRIPTION

Figure 1:
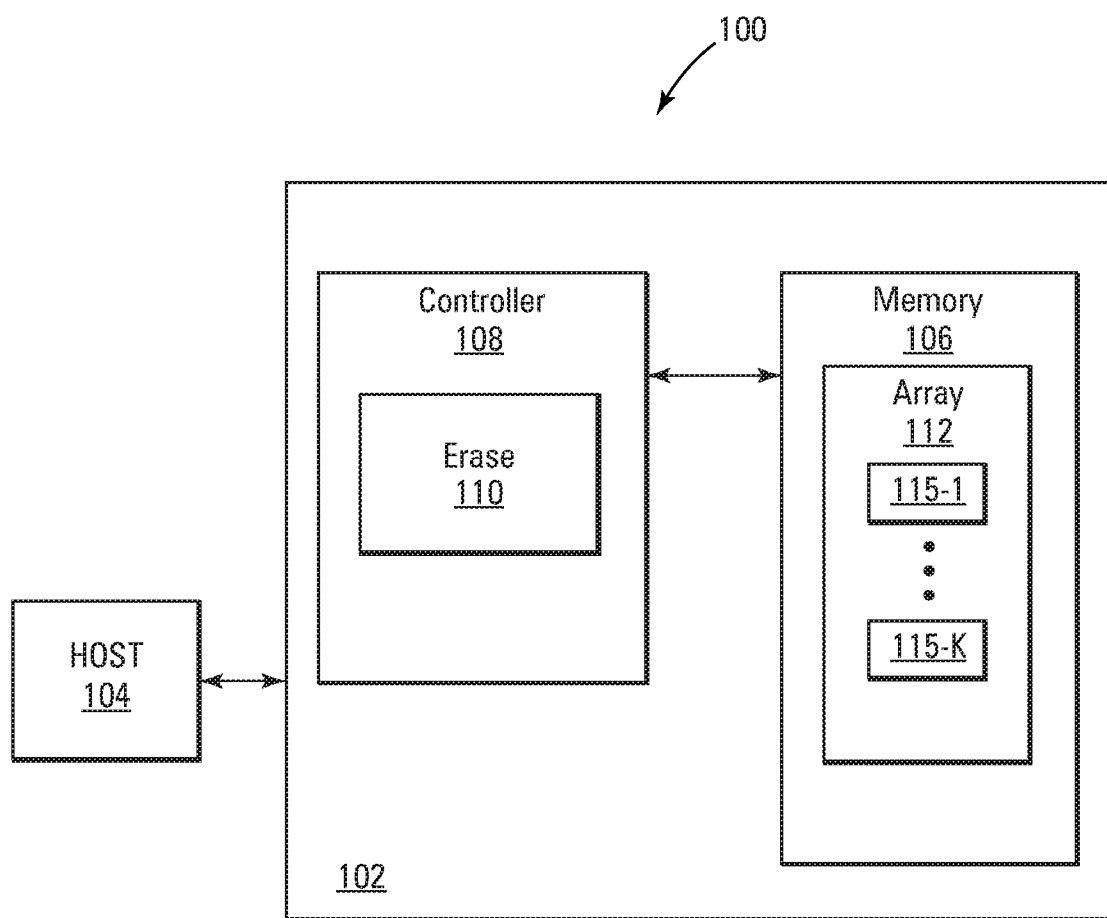
FIG. 1 is a block diagram of an apparatus in the form of a computing system, in accordance a number of embodiments of the present disclosure.

In an example embodiment, a first erase verify may be performed on a first set of memory cells of a portion of an array of memory cells. A second erase verify may be performed on a second set of memory cells of the portion of the array. A first erase voltage pulse may be applied concurrently to each memory cell in the portion of the array if the first set fails the first erase verify and if the second set fails the second erase verify. A second erase voltage pulse may be applied concurrently to each memory cell in the portion of the array if the first set passes the first erase verify and if the second set fails the second erase verify. The second erase voltage pulse may be different than the first erase voltage pulse.

As memory cells age and the number of program/erase cycles applied to the memory cells increases, the memory cells may experience a shallow erase condition characterized by the Vts of the memory cells, subsequent to an erase operation, having an increased value (e.g., less negative) relative to their Vt levels subsequent to prior erases. As the erased Vts increase, the number of erase voltage pulses that may be needed to erase the memory cells (e.g., by adjusting their Vts to a sufficiently deep level) may need to increase. Some previous approaches have used erase voltage pulses that are large enough (e.g., in voltage and/or time duration) to erase the memory cells as the number program/erase cycles becomes relatively large. However, this can lead to over erasure for lower numbers of program/erase cycles, in that the erase voltage pulses may be too large for lower numbers of program/erase cycles (e.g., when the memory cells are relatively new). Embodiments of the present disclosure provide a technical advantage by solving this problem. For example, the embodiments provide self-adaptive, dynamic adjustment of the erase voltage pulses as the number program/erase cycles increases.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure, and should not be taken in a limiting sense.

As used herein, "a number of" something can refer to one or more of such things. For example, a number of memory cells can refer to one or more memory cells. A "plurality" of something intends two or more. As used herein, multiple acts being performed concurrently refers to acts overlapping, at least in part, over a particular time period. As used herein, the term "coupled" may include electrically coupled, directly coupled, and/or directly connected with no intervening elements (e.g., by direct physical contact) or indirectly coupled and/or connected with intervening elements. The term coupled may further include two or more elements that co-operate or interact with each other (e.g., as in a cause and effect relationship).

FIG. 1 is a block diagram of an apparatus in the form of a computing system 100, in accordance with a number of embodiments of the present disclosure. The computing system 100 includes an electronic storage system 102 that may be, for example, a solid-state drive (SSD). In the example of FIG. 1, storage system 102 is coupled to a host 104 and includes a memory 106, such as a memory device, that can be a non-volatile memory, such as a NAND flash memory among others. For example, memory 106 includes a memory array 112, such as three-dimensional memory array, that includes a number of memory blocks 115, such as memory blocks 115-1 to 115-K that may be erased using the methods disclosed herein.

A controller 108 (e.g., an SSD controller), such as a processing device, is coupled to memory 106. Controller 108 includes an erase component 110, such as an erase engine, configured to perform various methods (e.g., the erase operations) disclosed herein. As used herein, a storage system (e.g., 102), a controller (e.g., 108), a memory (e.g., 106), and/or a memory array (e.g., 112) may separately be considered an "apparatus."

Figure 2A:
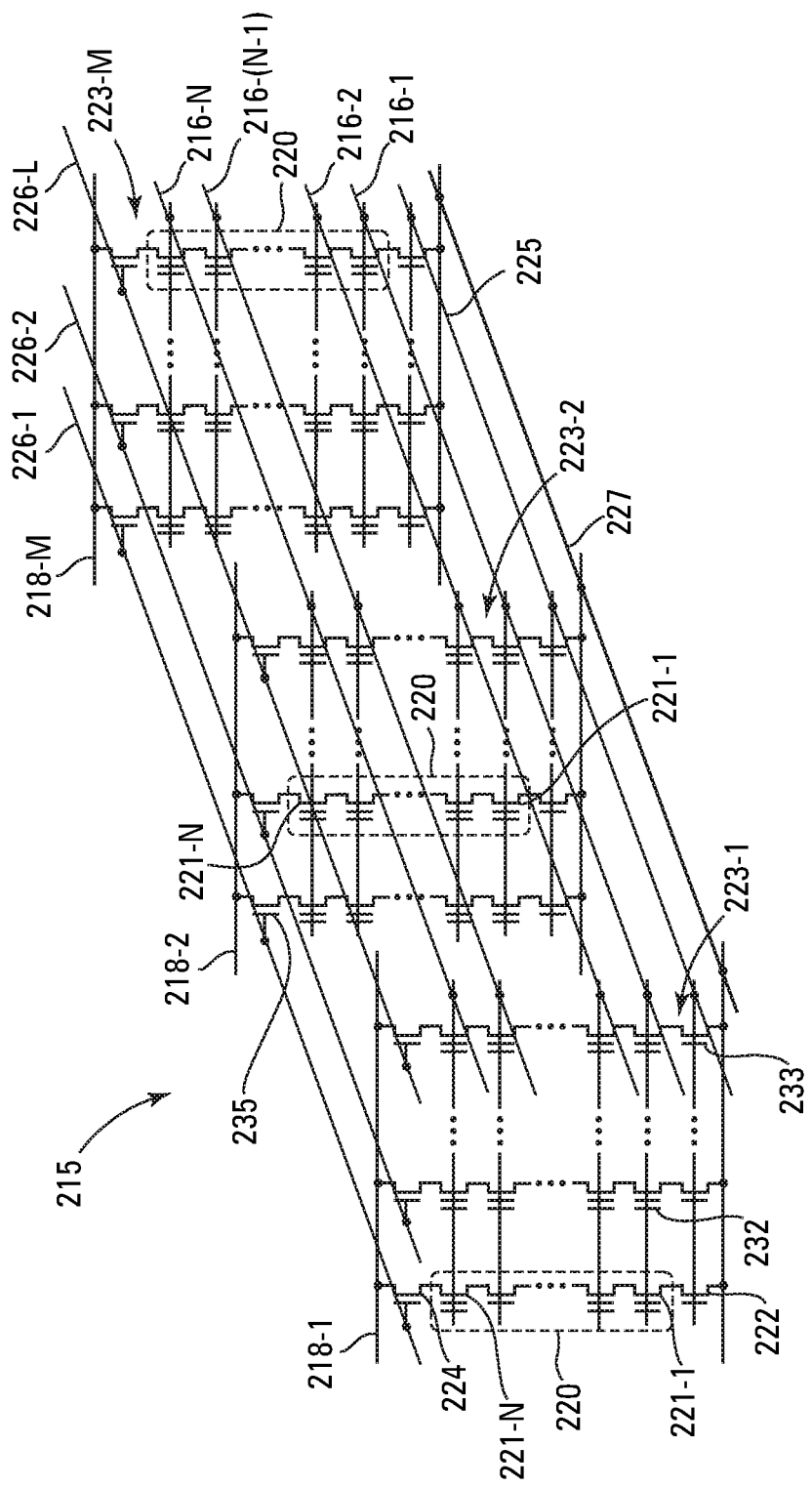
FIG. 2A is schematic of a portion of a three-dimensional (3D) memory array of memory cells that may be erased using the erase operations disclosed herein, in accordance with a number of embodiments of the present disclosure.

FIG. 2A is schematic of a block 215 of memory cells in accordance with a number of embodiments of the present disclosure. Although the block 215 is a three dimensional block of memory cells, the present disclosure is not limited to three-dimensional memory arrays. Block 215 may be erased in accordance with the embodiments disclosed herein. Memory blocks 115 may be configured in a similar (e.g., the same) manner as block 215 in some examples.

Block 215 includes a number of groups of series-coupled memory cells, such as strings 220 of series-coupled memory cells 221. For example, each string 220 may include series-coupled memory cells 221-1 to 221-N respectively at different levels within block 215. Each respective string 220 is coupled in series between a respective select transistor 222 that is coupled to a common source 227 and a respective select transistor 224. The control gates 233 of select transistors 222 are commonly coupled to a common select line 225.

Each respective select transistor 222 is configured to selectively couple a respective string 220 to common source 227 in response to an activation voltage being applied to the control gate 233 of each respective select transistor 222 by common select line 225. For example, when an activation voltage is applied to common select line 225, all of select transistors 222 are concurrently activated and all of strings 220 are concurrently coupled to common source 227.

Strings 220 are arranged in a number of subarrays 223, such as subarrays 223-1 to 223-M. Each respective one of subarrays 223-1 to 223-M is associated with a respective one of data lines 218-1 to 218-M. For example, each respective string 220 in each respective subarray 223 is coupled to a respective select transistor 224 that is coupled to the respective data line 218 associated with the respective subarray 223. For example, each respective string 220 in subarray 223-1 is coupled to data line 218-1, each respective string 220 in subarray 223-2 is coupled to data line 218-2, etc.

The control gates 232 of memory cells 221 at each respective level are commonly coupled to a respective access line 216. For example, memory cells 221-1 to 221-N are respectively commonly coupled to access lines 216-1 to 216-N. Each of respective select lines 226-1 to 226-L is commonly coupled to the control gate 235 of one select transistor 224 from each subarray 223. Each respective select transistor 224 is configured to selectively couple a respective string 220 to a respective data line 218 in response to an activation voltage being applied to a control gate of the respective select transistor 224 by a respective select line 226.

Figure 2B:
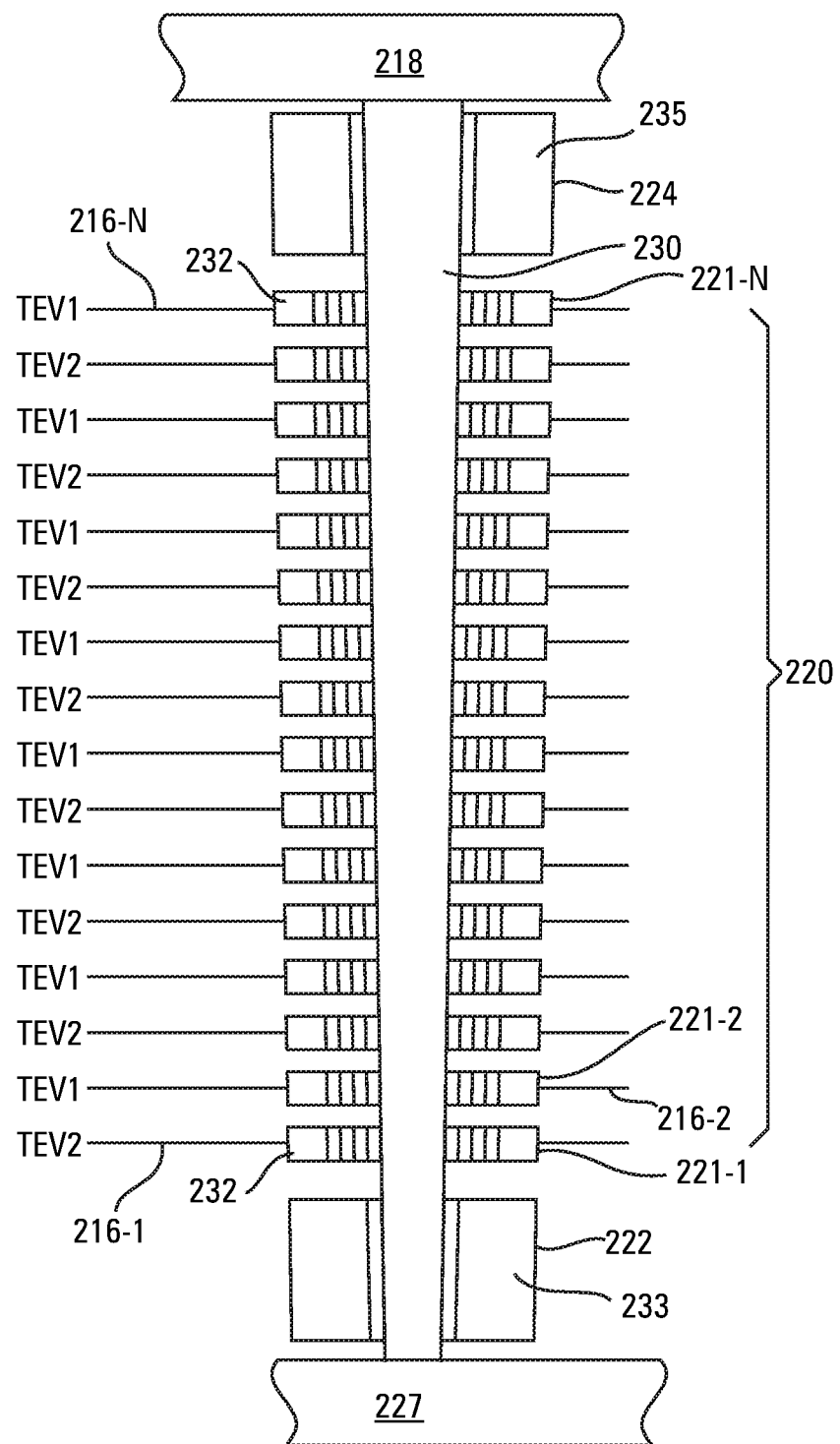
FIG. 2B illustrates a group of memory cells adjacent to a pillar, in accordance with a number of embodiments of the present disclosure.

Block 215 may incorporate structures that may include semiconductor pillars, such as semiconductor pillar 230, in FIG. 2B. A portion of pillar 230 may act as a channel region of the memory cells of a string 206. FIG. 2B illustrates a portion of block 215, such as string 220 of series-coupled memory cells 221 adjacent to semiconductor pillar 230, in accordance with a number of embodiments of the present disclosure. For example, string 220 may be erased in accordance with the embodiments disclosed herein. In the example of FIG. 2B, each memory cell 221 may wrap completely around pillar 230 as do select transistors 222 and 224.

In a number of embodiments of the present disclosure, a first erase verify is performed on a first set of memory cells of block 215 by concurrently applying an erase verify voltage TEV1 to the respective access lines 216 coupled to the respective control gates 232 of the first set of memory cells, and a different second erase verify is performed on a second set of memory cells by concurrently applying a different erase verify voltage TEV2 (e.g., greater in magnitude than TEV1) to the respective access lines 216 coupled to the respective control gates 232 of the second set of memory cells. A pass voltage may be applied to the access lines coupled to the second set of memory cells to activate (e.g., turn on) the second set of memory cells while the erase verify voltage TEV1 is applied to the first set of memory cells, and a pass voltage may be applied to the access lines coupled to the first set of memory cells to activate (e.g., turn on) the first set of memory cells while the erase verify voltage TEV2 is applied to the second set of memory cells. The reasoning behind using the pass voltages and using two different erase verifies with two different erase verify voltages is discussed further below.

The first set of memory cells includes a particular portion of the memory cells of each string 220, and the second set of memory cells includes a remaining portion of the memory cells of each string 220. The memory cells in the particular portion of each respective string 220 that belong to the first set may alternate with the memory cells in the remaining portion of each respective string 220 that belong second set so that each respective memory cell from the first set in a string 220 is immediately adjacent to a respective memory cell from the second set in the string 220. For example, the respective even-numbered cells in each string that are coupled to respective even-numbered access lines may belong to the first set, and the respective odd-numbered cells in each string that are coupled to respective odd-numbered access lines may belong to the second set, as shown in FIG. 2B. In other examples, the first set may include the odd-numbered cells of each respective string 220, and second set may include the even-numbered cells of each respective string 220.

Figure 3:
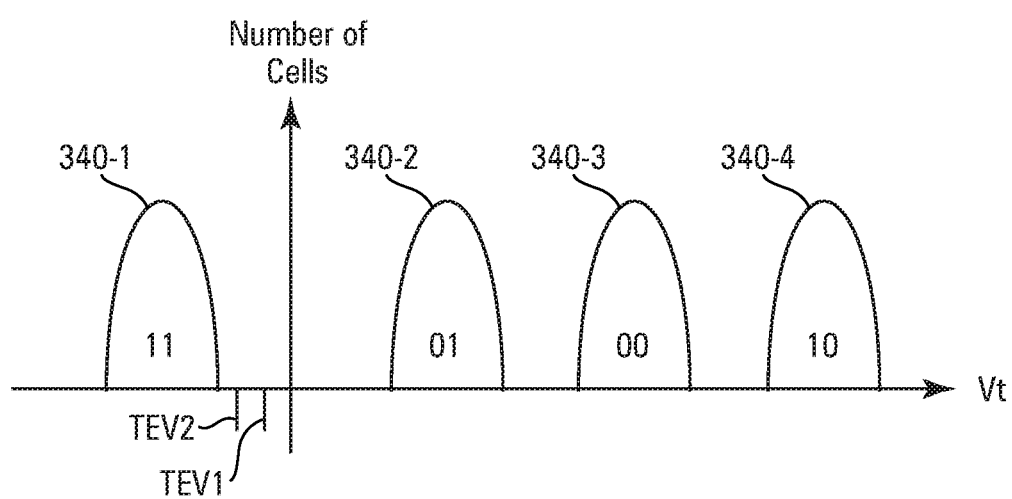
FIG. 3 illustrates threshold-voltage distributions, including an erase distribution resulting from the erase operations disclosed herein, in accordance with a number of embodiments of the present disclosure.

FIG. 3 illustrates threshold-voltage (Vt) distributions associated with multilevel memory cells (e.g., cells such as cells 221 shown in FIG. 2A programmable to store multiple bits per cell) erasable in accordance with a number of embodiments of the disclosure. For example, Vt distributions 340-1 to 340-4 may respectively correspond to different data states. Each distribution 340 may correspond to a different bit pattern that can be stored by memory cells 221 at a respective data state. In general, the number of data states used to represent a bit pattern of P bits may be $2^P$.

Distributions 340-1, 340-2, 340-3, and 340-4 respectively correspond to bit patterns 11, 01, 00, and 10. Vt distribution 340-1 corresponds to the erase data state (e.g., erase state) of memory cells 221 and may be referred to as the erase distribution, and Vt distributions 340-2, 340-3, and 340-4 respectively correspond to different program data states. The erase operations disclosed herein may be used to erase the memory cells 221 in block 215 to the erase state. For example, the erase verify voltages TEV1 and TEV2 may be respectively applied to the first and second sets of memory cells during the erase operations.

Block 215 may be erased to the erase state before programming respective numbers of the memory cells to respective ones of the program data states. The Vt ranges between the respective Vt distributions correspond to margins. If the margins are too small, it may be difficult to determine the state of the memory cells. The disclosed self-adaptive, dynamic adjustment of the erase voltage pulses as the number program/erase cycles increases acts to maintain the margin between distributions 340-1 and 340-2 relatively constant as the number program/erase cycles increases.

The example of FIG. 3 corresponds to two-bit-per-cell programming. However, the present disclosure is not limited to only two-bit-per-cell programming and may include single-bit-per-cell programming having two data states, three-bit-per-cell programming having eight data states, four-bit-per-cell programming having 16 data states, or the like, each including an erase state obtained by the embodiments described herein. In an example of single-bit per cell programming, there may be an erase state corresponding to a single bit (e.g., 1) and having Vt distribution 340-1 and a program data state corresponding to a single bit, (e.g., 0) and having Vt distribution 340-2.

Figure 4A:
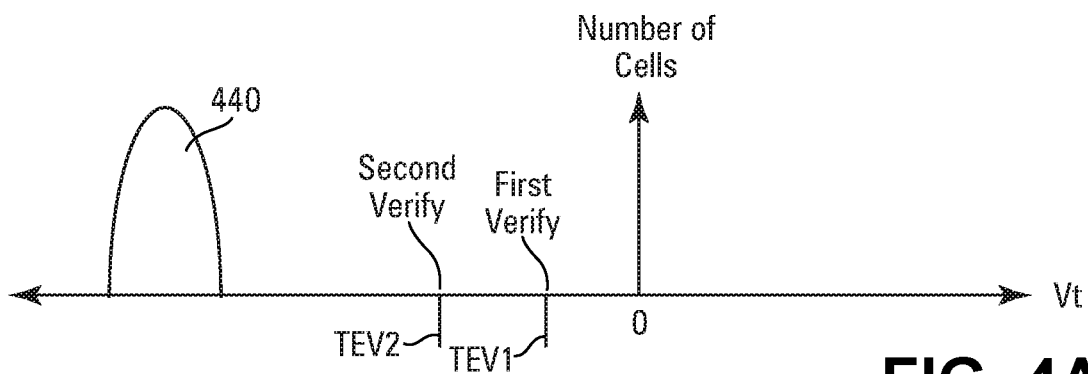
FIG. 4A illustrates the position of an erase distribution corresponding to memory cells passing different erase verifies, in accordance with a number of embodiments of the present disclosure.
Figure 4B:
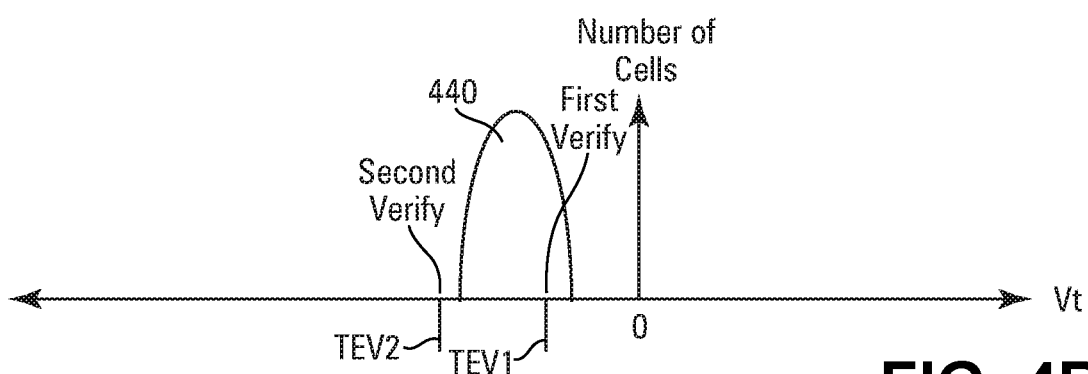
FIG. 4B illustrates the position of an erase distribution corresponding to memory cells failing different erase verifies, in accordance with a number of embodiments of the present disclosure.
Figure 4C:
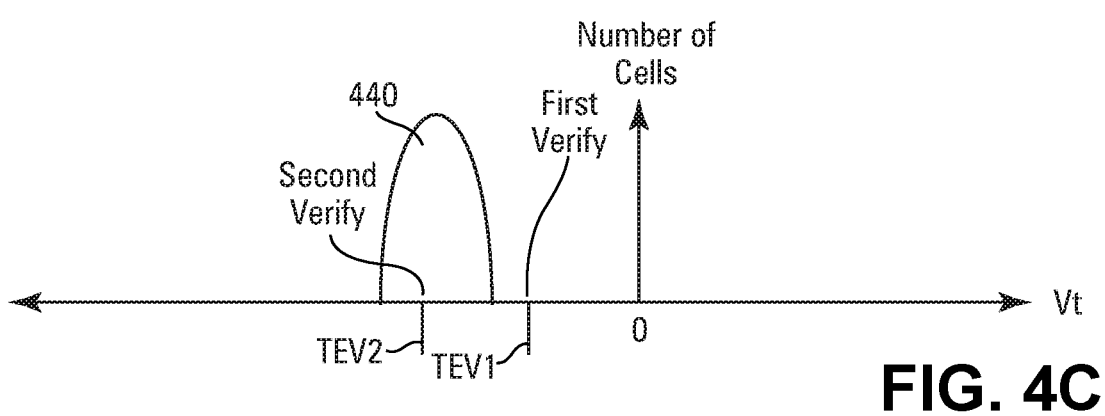
FIG. 4C illustrates the position of an erase distribution corresponding to memory cells passing an erase verify and failing another erase verify, in accordance with a number of embodiments of the present disclosure.
Figure 4D:
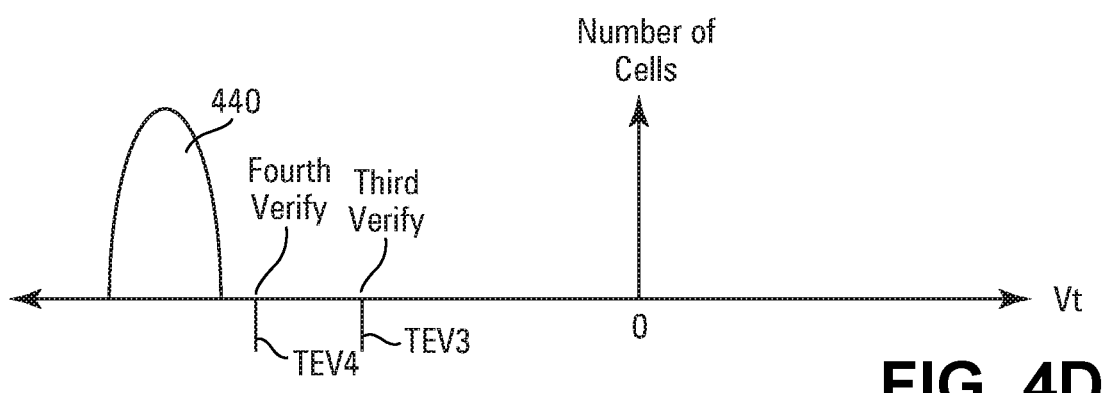
FIG. 4D illustrates the placement of erase verify voltages and an erase distribution responsive to the position of the erase distribution in FIG. 4C, in accordance with a number of embodiments of the present disclosure.
Figure 5:
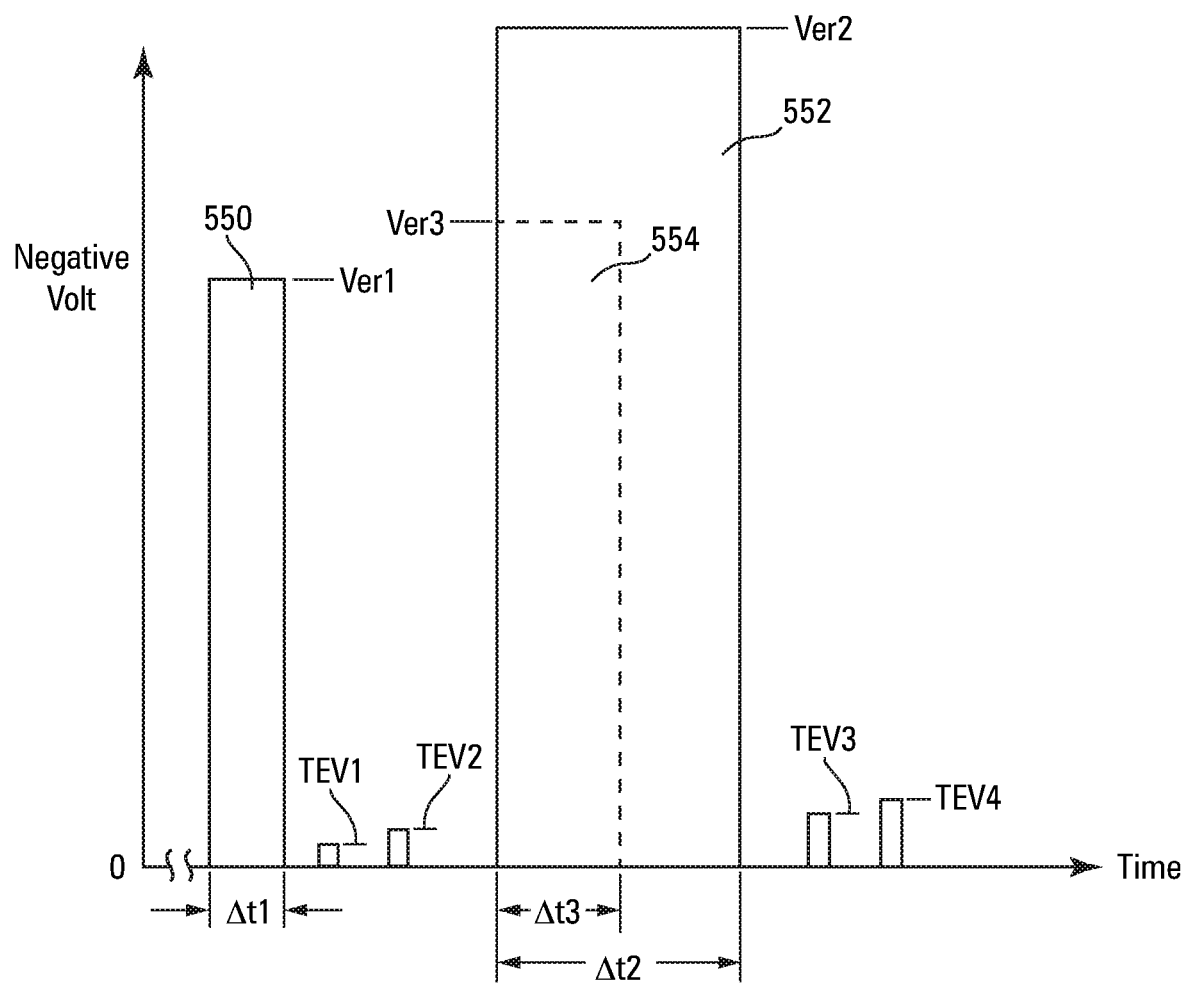
FIG. 5 illustrates erase voltage pulses and erase verify voltages, in accordance with a number of embodiments of the present disclosure.

FIGS. 4A to 4C show the position of an erase distribution 440 for block 215 on a Vt axis in response to applying an erase voltage pulse to the all the memory cells of block 215 concurrently, in accordance with a number of embodiments of the present disclosure. Erase distribution 440 may be the erase distribution 340-1 in FIG. 3, for example. FIG. 4D illustrates placement of erase verify voltages and the erase distribution 440 responsive to the position of the erase distribution 440 in FIG. 4C, in accordance with a number of embodiments of the present disclosure. FIG. 5 illustrates erase voltage pulses and erase verify voltages in accordance with a number of embodiments of the present disclosure. For example, the voltages in FIG. 5 are negative and the voltage on the vertical axis (e.g., the y-axis) increases in the negative sense in the direction of the arrow.

The erase voltage pulses 550, 552 and 554 in FIG. 5 may be applied to (e.g., across) each memory cell in block 215 during an erase operation. For example, erase voltage pulses 550, 552 and 554 are negative differential erase pulses and respectively have voltages Ver1, Ver2, and Ver3.

The respective voltages of the erase pulses 550, 552 and 554 are respective voltages of respective voltage pulses concurrently applied to each semiconductor pillar 230, and thus the channel of each string 220, during an erase operation minus a respective voltage concurrently applied to the common access lines 216-1 to 216-N, and thus the control gates 232 of each memory cell in each string 220, during the erase operation. For example, the voltage applied to the access lines may be relatively small compared to the voltage of the pulses applied to the pillars and may be zero volt (e.g., ground voltage) in some examples. For examples in which the voltage applied to the access lines is zero volt, the magnitude of the voltage pulses applied to the pillars may be equal in magnitude (e.g., to within routine variations of the voltages applied to the pillars and access lines) to the voltages Ver1, Ver2, and Ver3 respectively of erase voltage pulses 550, 552 and 554.

The erase verify voltages TEV1 and TEV2 in FIGS. 3, 4A to 4C, and 5 and the erase verify voltages TEV3 and TEV4 in FIGS. 4D and 5 are negative voltages applied to the access lines 216-1 to 216-N respectively commonly coupled to the control gates 232 of memory cells 221-1 to 221-N in each string 220 during erase verifies.

The example of FIG. 4A illustrates the position of distribution 440 resulting from the first set of memory cells of block 215 passing the first erase verify and the second set of memory cells of block 215 passing the second erase verify. The first erase verify may be applied to the first set of memory cells and the second erase verify may be applied to the second set of memory cells in response to applying erase voltage pulse 550 to the all the memory cells in block 215 concurrently (e.g., to each memory cell 221 in each string 220). The example of FIG. 4A may correspond to a situation where the memory cells are relatively new and relatively few program/erase cycles have been performed on the memory cells.

The first erase verify includes applying erase verify voltage TEV1 to the first set of memory cells while applying the pass voltage to the memory cells in the second set, and second erase verify includes applying erase verify voltage TEV2 to the second set of memory cells while applying the pass voltage to the memory cells in the first set. The same particular failure criterion may be applied during the first and second erase verifies to determine to determine erase verify results of the first and second erase verifies. For example, same particular failure criterion may be applied during the first and second erase verifies to determine whether the first and second sets of memory cells respectively pass the first and second erase verifies for embodiments in which different erase verify voltages TEV1 and TEV2 are respectively applied during the first and second erase verifies. In some examples, the magnitude of erase verify voltage TEV2 is greater than the magnitude of erase verify voltage TEV1.

The particular failure criterion may include a particular threshold number of memory cells 221 of the first set (e.g., a particular threshold number of strings 220) that is allowed to fail the first erase verify without the first set failing the first erase verify and the same particular threshold number of memory cells 221 of the second set (e.g., the particular threshold number of strings 220) that is allowed to fail the second erase verify without the second set failing the first erase verify. An erase verify fail of a set may involve the number of memory cells of the set failing the erase verify for the set being greater than the particular threshold number of cells and an erase verify pass of the set may involve the number memory cells of the set failing the erase verify for the set being less than or equal to the particular threshold number. In some examples, the threshold number of cells may be a count fail (CF) byte value for the cells. Therefore, the number of cells that fail the respective first and second erase verifies may be determined and compared to the CFbyte value. For the example of FIG. 4A, the number of cells of the first set that passed the first erase verify and the number of cells of the first set that passed the second erase verify may be less than or equal to the same CFbyte value for the first and second sets.

Alternatively, an erase verify fail of a set may involve the number of strings 220 failing the erase verify of the set being greater than a particular threshold number of strings and an erase verify pass may involve the number of strings 220 failing the erase verify being less than or equal to the particular threshold number. In some examples, threshold number may be a count fail (CF) byte value for the strings. Therefore, the number of strings that fail the respective first and second erase verifies may be determined and compared to the CFbyte value. Note that for the example of FIG. 4A, the number of strings that passed each of the first and second erase verifies may be less than or equal to the same CFbyte value for the strings.

Note that the first erase verify may be applied only to the first set and not to the second set, and the result of applying the first erase verify to the first set is taken to apply the whole string (e.g., to both the first and second sets). Similarly, the second erase verify may be applied only to the second set and not to the first set, and the result of applying the second erase verify to the second set is taken to apply the whole string (e.g., to both the first and second sets). The idea here is that the cells in the first and second sets may behave in the same manner, in that they are in the same block. Applying first erase verify only to the first set and the second erase verify only to the second set reduces the number of erase verifies.

During the first and second erase verifies, a voltage may be applied to each of the data lines 218, and the select transistors 224 may be activated concurrently to couple the voltage to the ends of the strings 220 adjacent to the select transistors 224, and thus the ends the pillars 230 adjacent to the select transistors 224, concurrently. While the voltage is concurrently applied to the ends of the strings 220 adjacent to the select transistors 224, a lower voltage (e.g., zero volt) may be applied to common source 227 and all of the select transistors 222 may be activated concurrently so that the lower voltage is coupled to opposite end of the strings adjacent to the select transistors 222, and thus the opposite ends of the pillars 230 adjacent to the select transistors 222, concurrently. Therefore, there is voltage differential between the ends of each string 220, and the ends of the pillars 230.

Determining whether a string 220 fails a respective erase verify may involve determining whether a particular level of current flows through the string 220 during the respective erase verify. This may be best understood with reference to FIG. 2B. For example, during the first erase verify, while the voltage differential is applied to between the ends of strings 220 and pillar 230, the erase verify voltage TEV1 is applied to the access lines coupled to the control gates of the portion of the first set of memory cells in string 220, as shown in FIG. 2B, while the pass voltage is applied access lines coupled to the control gates of the remaining memory cells in string 220 corresponding to the second set.

The pass voltages turn on the memory cells to which they are coupled. Each memory cell from the first set that passes the first erase verify also turns on in response to erase verify voltage TEV1. If all of the memory cells in the first set turn on in response to erase verify voltage TEV1, then all of the memory cells in the string are turned on, causing pillar 230 to conduct and causing current to flow from data line 218 through pillar 230, and thus the string 220, to source 227. Therefore, the memory cells of the first set in string 220, and thus string 220, passes the first erase verify.

The current may be sensed to determine whether the string passes the erase verify. For example, the string is determined to pass the erase verify in response to the current being greater than a particular level, and is determined to fail the erase verify in response to the current being less than or equal to the particular level. Note that a memory cell will turn on in response to the erase verify voltage being greater (e.g., less negative) than the Vt of the memory cell.

If one or more of the memory cells from the first set fails to turn on in response to erase verify voltage TEV1, then pillar 230 may remain in a high impedance state, so that little or no current can flow through pillar 230, and the memory cells of the first set in the string, and thus the string, fails the first erase verify. Therefore, determining the amount of current through a string 220 determines whether the memory cells of the first set in the string, and thus the string, passes or fails the first erase verify. The process may be repeated for the second erase verify in which the erase voltage TEV2 is applied to the access lines coupled to the control gates of the portion of the second set of memory cells in string 220, as shown in FIG. 2B, while the pass voltage is applied access lines coupled to the control gates of the remaining memory cells in string 220 corresponding to the first set. Moreover, the first erase verify is performed for the first set in each string in block 215 concurrently, and the second erase verify is performed for the second set in each string in block 215 concurrently.

In some examples, the respective erase verifies may be performed for a respective portion of the memory cells in each string while the pass voltage is applied to the remaining cells in each string because the erase verify voltages are low compared to the pass voltages. For example, if an erase verify voltage is applied to each memory cell in a string and causes each memory cell to turn on, the erase verify voltages may be too low to cause the pillar to conduct enough current to discriminate between an erase verify fail and an erase verify pass. Applying the pass voltages to a portion of the cells in the string while applying the erase verify voltage to the remaining cells can remedy this problem.

In other embodiments, an erase verify may involve applying the same erase verify voltage to the first and second sets (e.g., TEV1=TEV2=TEV) and using different failure criteria for the first and second sets. A first failure criterion for the first set may include a first CFbyte value, and a second different failure criterion for the second set may include a second (e.g., different) CFbyte value that, for example, may be greater than the first CFbyte value. Note that a CFbyte value may be a CFbyte value for the strings, for which the CFbyte value is a threshold number of strings, or a CFbyte value for the set of cells, for which the CFbyte value is a threshold number of cells of the set.

The example of FIG. 4B illustrates the position of distribution 440 corresponding to the first set of memory cells of block 215 failing the first erase verify and the second set of memory cells of block 215 failing the second erase verify. The first and second erase verifies may be as described previously in conjunction with FIG. 4A. For example, erase verify voltage TEV1 may be applied during the first erase verify; erase verify voltage TEV2 may be applied for the second erase verify; and the same CFbyte value may be used for both erase verifies. Alternatively, same erase verify voltage TEV may be applied during the first and second erase verifies; the first CFbyte value may be used for the first erase verify; and the second CFbyte value may be used for the second erase verify.

For example, erase distribution 440 in FIG. 4B may be in response to applying erase voltage pulse 550 to all the memory cells in block 215 concurrently. In some examples, the memory cells in the example of FIG. 4B may be exposed to a greater number of program/erase cycles than in the example of FIG. 4A and may require a greater number of erase voltage pulses to pass the erase verify. For example, in response to erase voltage pulse 550, the Vts corresponding to erase distribution 440 may increase and erase distribution 440 may move to the right as the number of program/erase cycles increases, as shown in going from FIG. 4A to FIG. 4B.

The erase voltage pulse 552 may be applied to all the memory cells of block 215 in response to determining that erase distribution 440, resulting from applying erase voltage pulse 550, failed the first erase verify applied to the first set and the second erase verify applied to the second set. For example, erase voltage pulse 552 may have a voltage Ver2 greater in magnitude than the voltage Ve1 of erase voltage pulse 550 and/or have a greater time duration (e.g., width) $\Delta t2$ than the time duration $\Delta t1$ of erase voltage pulse 550. For example, erase voltage pulse 552 may have a voltage Ver2 greater in magnitude than the voltage Ve1 of erase voltage pulse 550 or have a greater time duration $\Delta t2$ than the time duration $\Delta t1$ of erase voltage pulse 550 or have the voltage Ver2 greater in magnitude than the voltage Ve1 of erase voltage pulse 550 and have the greater time duration $\Delta t2$ than the time duration $\Delta t1$ of erase voltage pulse 550.

The example of FIG. 4C illustrates the position of distribution 440 corresponding to the first set of memory cells of block 215 passing the first erase verify and the second set of memory cells of block 215 failing the second erase verify. The first and second erase verifies may be as described previously in conjunction with FIGS. 4A and 4B.

Erase distribution 440 may be in response to applying erase voltage pulse 550 to all the memory cells in block 215 concurrently. In some examples, the memory cells in the example of FIG. 4C may be exposed to a greater number of program/erase cycles than in the example of FIG. 4A and a lesser number of program/erase cycles than in the example of FIG. 4B. For example, responsive to erase voltage pulse 550, the erase distribution 440 in FIG. 4A may move to the right to the location in FIG. 4C, and the erase distribution 440 in FIG. 4C may move to the right to the location in FIG. 4B, as the number of program/erase cycles increases.

An additional erase voltage pulse may be needed so that the second set, and thus strings 220, pass the second erase verify. Therefore, instead of applying erase voltage pulse 552, a modified erase voltage pulse 554 may be applied to block 215 in response to the situation depicted in FIG. 4C, for example, without performing an erase verify after applying erase voltage pulse 554. For example, erase voltage pulse 554 may have a voltage Ver3 greater in magnitude than the voltage Ve1 of erase voltage pulse 550 and lower in magnitude than the voltage Ve2 of erase voltage pulse 552 and/or have a time duration $\Delta t3$ greater than the time duration $\Delta t1$ of erase voltage pulse 550 and less than the time duration $\Delta t2$ of erase voltage pulse 552. For example, erase voltage pulse 554 may have the voltage Ver3 greater in magnitude than the voltage Ve1 and lower in magnitude than the voltage Ve2 or have the time duration $\Delta t3$ greater than the time duration $\Delta t1$ and less than the time duration $\Delta t2$ or have the voltage Ver3 greater in magnitude than the voltage Ve1 and lower in magnitude than the voltage Ve2 and have the time duration $\Delta t3$ greater than the time duration $\Delta t1$ and less than the time duration $\Delta t2$.

FIGS. 4A, 4C, and 4B may respectively illustrate the position of erase distribution 440 in response to erase voltage pulse 550 as block 215 ages, for example, as the number of program/erase cycles increase. For a relatively low number of program/erase cycles, the position of erase distribution 440 in FIG. 4A illustrates that block 215 passes both erase verifies in response to erase voltage pulse 550, and additional erase voltage pulses may not be needed. For an intermediate number of program/erase cycles, the position of erase distribution 440 in FIG. 4C illustrates that block 215 passes the first erase verify and fails the second erase verify, and erase voltage pulse 554 may be applied responsive to this condition. For a relatively high number of program/erase cycles, the position of erase distribution 440 in FIG. 4B illustrates that block 215 fails both the first erase verify and the second erase verify, and erase voltage pulse 552 may be applied responsive to this condition.

Applying no additional erase voltage pulses after erase voltage pulse 550 may occur until erase voltage pulse 554 is applied in response to the condition of FIG. 4C first occurring. For example, voltage pulse 554 may be inherently applied in response to the number of program/erase cycles reaching the number of program/erase cycles when the condition FIG. 4C first occurs. This is an example of self-adaptive, dynamic adjustment of the erase voltage pulse in response to the number of program/erase cycles, without needing to keep track of the number of program/erase cycles.

Applying erase voltage pulse 554 voltage after erase voltage pulse 550 may occur until erase voltage pulse 552 is applied in response to the condition of FIG. 4B first occurring. For example, erase voltage pulse 554 may be self adaptively, dynamically changed to erase voltage pulse 552 inherently in response to the number of program/erase cycles reaching the number of program/erase cycles when the condition FIG. 4B first occurs. For example, the adjustment may occur without needing to determine the number of program/erase cycles, and changing the erase voltage pulse from pulse 554 to 552 in response to the determined number of program/erase cycles.

In other embodiments, erase voltage pulse 552 may be applied in response to in response to the situation depicted in FIG. 4C to move the erase distribution 440 from its position in FIG. 4C to the position in FIG. 4D, for example.

After applying erase voltage pulse 552, a third erase verify performed on the first set of memory cells and a fourth erase verify performed on the second set of memory cells. In some examples, the third erase verify may involve applying the erase verify voltage TEV3 to the first set and the fourth erase verify may involve applying the erase verify voltage TEV4 to the second set. The same CFbyte value may be used for both erase verifies using the different erase verify voltages TEV3 and TEV4.

The erase verify voltage TEV3 and the erase verify voltage TEV4 may be respectively applied in a manner similar to (e.g., the same as) that previously described for the erase verify voltage TEV1 and the erase verify voltage TEV2. The third erase verify may be the same as the first erase verify previously described with the erase verify voltage TEV3 replacing the erase verify voltage TEV1, and the fourth erase verify may be the same as the second erase verify previously described with the erase verify voltage TEV4 replacing the erase verify voltage TEV2. For example, the magnitude of erase verify voltage TEV1 may be increased to the magnitude of third erase verify voltage TEV3 in response to the condition of FIG. 4C, and the magnitude of erase verify voltage TEV2 may be increased to the magnitude of erase verify voltage TEV4 in response to the condition of FIG. 4C. In some examples, the magnitude of erase verify voltage TEV3 is greater than the magnitude erase verify voltage TEV1 and the magnitude erase verify voltage TEV2, and the magnitude of the erase verify voltage TEV4 is greater than the magnitude of the erase verify voltage TEV3.

In other embodiments, TEV3=TEV4=TEVV and different CFbyte values may be used for the first and second sets. For example, a third CFbyte value may be used for the first set and a fourth CFbyte value may be used for the second set. In some examples, TEVV may be greater than TEV previously described in conjunction with FIGS. 4A and 4B, and third CFbyte value greater than the first and second CFbyte values previously described in conjunction with FIGS. 4A and 4B and the fourth CFbyte value greater than the third CFbyte value.

Figure 6:
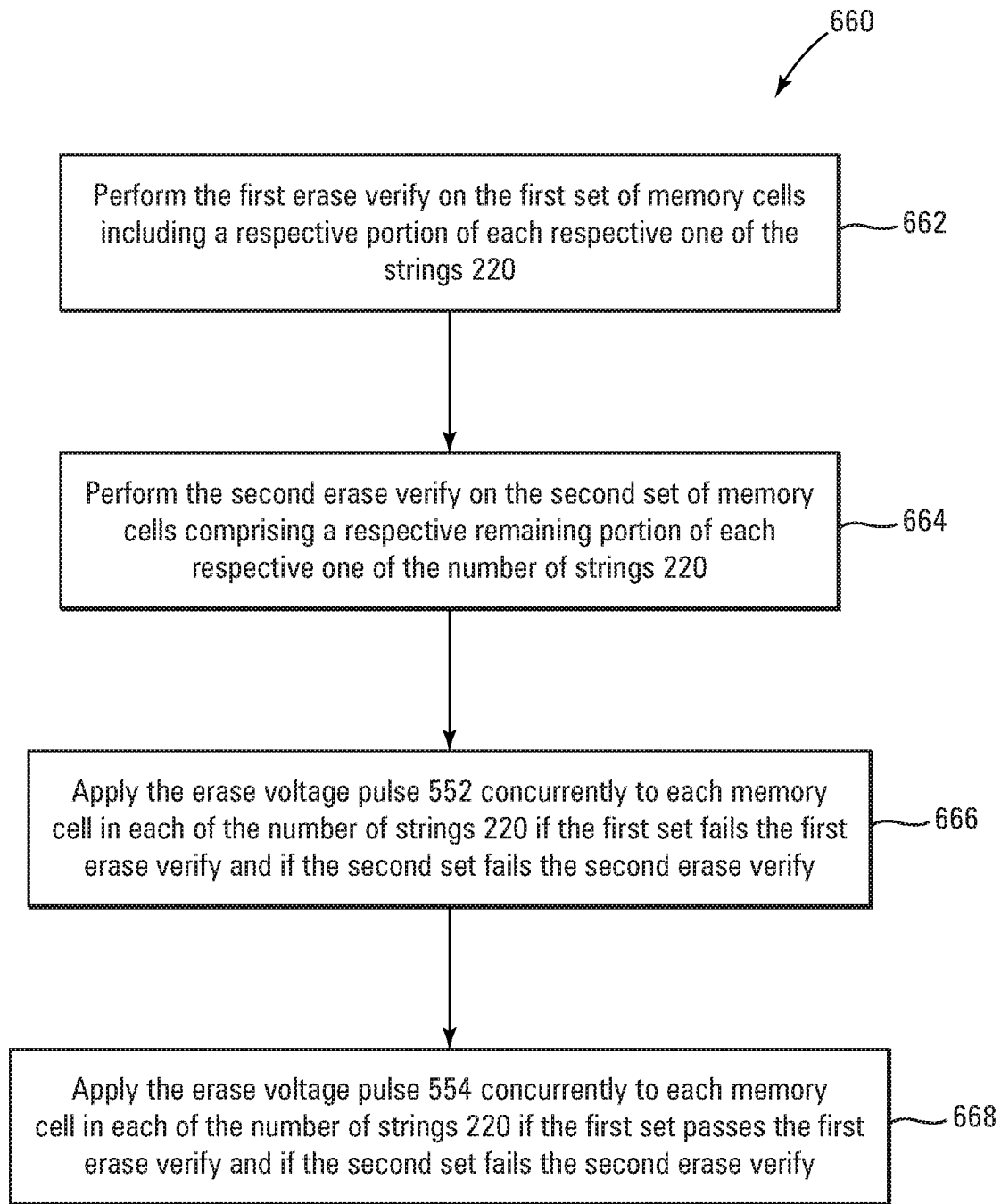
FIG. 6 is a flowchart of a method, in accordance with a number of embodiments of the present disclosure.

FIG. 6 is a flowchart of a method 660, in accordance with a number of embodiments of the present invention. For example, erase component 110 may be configured to cause method 660 to be performed.

At block 662 the first erase verify is performed on the first set of memory cells including a respective portion of each respective one of the strings 220. At block 664, the second erase verify is performed on the second set of memory cells comprising a respective remaining portion of each respective one of the strings 220. At block 666, the erase voltage pulse 552 is applied concurrently to each memory cell in each of the number of strings 220 if the first set fails the first erase verify and if the second set fails the second erase verify, as shown in FIG. 4B. At block 668, the erase voltage pulse 554 is applied concurrently to each memory cell in each of the number of strings 220 if the first set passes the first erase verify and if the second set fails the second erase verify, as shown in FIG. 4C. Although the arrows in FIG. 6 depict a particular order, method 660 is not so limited. For example, the order of blocks 662 and 664 may be interchanged and blocks 666 and 668 may be interchanged.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
performing a first erase verify on a first set of memory cells of a portion of an array of memory cells;
performing a second erase verify on a second set of memory cells of the portion of the array;
applying a first erase voltage pulse concurrently to each memory cell in the portion of the array if the first set fails the first erase verify and if the second set fails the second erase verify;
applying a second erase voltage pulse concurrently to each memory cell in the portion of the array if the first set passes the first erase verify and if the second set fails the second erase verify;
wherein the second erase voltage pulse is different than the first erase voltage pulse; and
applying a third erase voltage pulse when a number of erase operations and program operations reaches a first threshold number of the erase operations and the program operations, wherein a magnitude of the third erase voltage pulse changes when the number of the erase operations and the program operations reaches a second threshold number of the erase operations and the program operations.

2. The method of claim 1, wherein the second erase voltage pulse being different than the first erase voltage pulse comprises the second erase voltage pulse having at least one of:
a voltage lower in magnitude than a voltage of the first erase voltage pulse; and
having a shorter time duration than the first erase voltage pulse.

3. The method of claim 1, wherein:
the portion of the array comprises a number of strings of series-coupled memory cells;
the first set comprises a first group of the memory cells in each of the number strings; and
the second set comprises a second group of the memory cells in each of the number strings.

4. The method of claim 3, wherein the array comprises a three dimensional NAND array.

5. The method of claim 1, wherein the portion of array is a block of memory cells.

6. The method of claim 1, further comprising:
performing the first erase verify on the first set of memory cells while applying a pass voltage to the second set of memory cells; and
performing the second erase verify on the second set of memory cells while applying the pass voltage to the first set of memory cells.

7. The method of claim 6, further comprising:
performing the first erase verify on the first set of memory cells by applying a first erase verify voltage to the first set of memory cells;
performing the second erase verify on the second set of memory cells by applying a second erase verify voltage to the second set of memory cells; and
applying a same failure criterion to the first set of memory cells and the second set of memory cells.

8. The method of claim 6, further comprising:
performing the first erase verify on the first set of memory cells by applying an erase verify voltage to the first set of memory cells;
performing the second erase verify on the second set of memory cells by applying the erase verify voltage to the second set of memory cells; and
applying a first failure criterion to the first set of memory cells and a second failure criterion to second set of memory cells, wherein the second failure criterion is different than the first failure criterion.

9. The method of claim 8, wherein the first failure criterion comprises a first threshold number of memory cells in the first set that is allowed to fail the first erase verify without the first set failing the first erase verify, and the second failure criterion is a second threshold number of memory cells in the second set that is allowed to fail the second erase verify without the second set failing the second erase verify.

10. An apparatus, comprising:
a memory array comprising a number of groups of memory cells; and
a controller coupled to the memory array, the controller configured to:
perform a first erase verify on a first set of memory cells, while applying a pass voltage to a second set of memory cells, to determine a first erase verify result for the first set, the first set comprising a respective first portion of each respective one of a number of groups of memory cells, the second set of memory cells comprising a respective second portion of each respective one of the number of groups;
use the first erase verify result as a first erase verify result for each respective one of the number of groups;
perform a second erase verify on the second set of memory cells, while applying the pass voltage to the first set, to obtain a second erase verify result for the second set;
use the second erase verify result as a second erase verify result for each respective one of the number of groups; and
perform a third erase verify on the first set of memory cells, wherein a third erase voltage pulse is applied when a number of erase operations and program operations reaches a first threshold number of the erase operations and the program operations, and a magnitude of the third erase voltage pulse changes when the number of the erase operations and the program operations reaches a second threshold number of the erase operations and the program operations.

11. The apparatus of claim 10, wherein the controller is configured to:
apply an erase verify voltage to the first set during the first erase verify and apply a first criterion to determine the first erase verify result responsive to applying the erase verify voltage; and
apply the erase verify voltage to the second set during the second erase verify and apply a second criterion to determine the second erase verify result responsive to applying the erase verify voltage.

12. The apparatus of claim 11, wherein:
the controller being configured to apply the first criterion to determine the first erase verify result comprises the controller being configured to compare a number of the groups that failed the first erase verify to a first threshold number of the groups that is allowed to fail without failing the first erase verify; and
the controller being configured to apply the second criterion to determine the second erase verify result comprises the controller being configured to compare a number of the groups that failed the second erase verify to a second threshold number of the groups that is allowed to fail without failing the second erase verify, the second threshold number different than the first threshold number.

13. The apparatus of claim 10, wherein the controller is configured to:
apply a first erase verify voltage to the first set during the first erase verify and apply a criterion to determine the first erase verify result responsive to applying the first erase verify voltage; and
apply a second erase verify voltage to the second set during the second erase verify and apply the criterion to determine the second erase verify result responsive to applying the second erase verify voltage.

14. The apparatus of claim 13, wherein:
the controller being configured to apply the criterion to determine the first erase verify result comprises the controller being configured to compare a number of the groups that failed the first erase verify to a count fail byte value; and
the controller being configured to apply the criterion to determine the second erase verify result comprises the controller being configured to compare a number of the groups that failed the second erase verify to the count fail byte value.

15. The apparatus of claim 10, wherein the controller is configured to:
apply a first erase voltage pulse concurrently to each memory cell in each of the number of groups if the first result is an erase verify failure and if the second result is an erase verify failure; and
apply a second erase voltage pulse concurrently to each memory cell in each of the number of groups if the first result is an erase verify pass and if the second result is an erase verify failure;
wherein the second erase voltage pulse has a voltage lower in magnitude than a voltage of the first erase voltage pulse or has a shorter time duration than the first erase voltage pulse or has the voltage lower in magnitude than the voltage of the first erase voltage pulse and has the shorter time duration than the first erase voltage pulse.

16. The apparatus of claim 10, wherein the controller is configured to:
apply an erase voltage pulse concurrently to each memory cell in each of the number of groups if the first result is an erase verify pass and if the second result is an erase verify failure; and
responsive to applying the erase voltage pulse apply the third erase verify different than the first erase verify and the second erase verify to the first set and apply a fourth erase verify different than the third erase verify to the second set.

17. The apparatus of claim 16, wherein the controller is configured to:
apply a first erase verify voltage to the first set during the first erase verify;
apply a second erase verify voltage greater in magnitude than the first erase verify voltage to the second set during the second erase verify;
apply the third erase verify voltage greater in magnitude than the second erase verify voltage to the first set during the third erase verify; and
apply a fourth erase verify voltage greater in magnitude than the third erase verify voltage to the second set during the fourth erase verify.

18. An apparatus, comprising:
a memory array comprising a number of groups of memory cells; and
a controller coupled to the memory array, the controller configured to:
perform a first erase verify on a first set of memory cells by applying a first erase verify voltage to the first set, the first set comprising a respective first portion of each respective one of the number of groups;
perform a second erase verify on a second set of memory cells by applying a second erase verify voltage to the second set, the second erase verify voltage greater in magnitude than the first erase verify voltage, the second set comprising a respective second portion of each respective one of the number of groups;
apply a third erase voltage pulse when a number of erase operations and program operations reaches a first threshold number of the erase operations and the program operations, wherein a magnitude of the third erase voltage pulse changes when the number of the erase operations and the program operations reaches a second threshold number of the erase operations and the program operations; and
increase a magnitude of the first erase verify voltage to a third erase verify voltage and increase a magnitude of the second erase verify voltage to a fourth erase verify voltage responsive to the first set passing the first erase verify and the second set failing the second erase verify, the fourth erase verify voltage greater in magnitude than the third erase verify voltage.

19. The apparatus of claim 18, wherein the controller is configured to:
apply an erase voltage pulse to the number of groups responsive to the first set passing the first erase verify and the second set failing the second erase verify; and
responsive to applying the erase voltage pulse apply the third erase verify voltage to the first set and the fourth erase verify voltage to the second set.

20. The apparatus of claim 18, wherein the controller is configured to determine the second set as passing the first erase verify responsive to the first set passing the first program verify without the first program verify being performed on the second set and to determine the first set as failing the second erase verify responsive to the second set failing the second program verify without the second program verify being performed on the first set.

21. The apparatus of claim 18, wherein the controller is configured to:
determine the first set as passing the first program verify responsive to a number of the groups failing the first program verify being less than or equal to a threshold number; and
determine the second set as failing the second program verify responsive to a number of the groups failing the second program verify being greater than the threshold number.

22. The apparatus of claim 18, wherein the controller is configured to:
apply a pass voltage to the first set while applying the first erase verify voltage to the second set; and
apply the pass voltage to the first set while applying the second erase verify voltage to the second set.

23. The apparatus of claim 18, wherein the memory cells of each respective first portion of each respective one of the number of groups and the memory cells of each respective second portion of each respective one of the number of groups alternate.

24. The apparatus of claim 18, wherein memory array is a three dimensional NAND memory array.

* * * * *